United States Patent [19]
Lee et al.

[11] Patent Number: 5,930,167
[45] Date of Patent: Jul. 27, 1999

[54] MULTI-STATE NON-VOLATILE FLASH MEMORY CAPABLE OF BEING ITS OWN TWO STATE WRITE CACHE

[75] Inventors: Douglas J. Lee; Jian Chen, both of San Jose, Calif.

[73] Assignee: SanDisk Corporation, Sunnyvale, Calif.

[21] Appl. No.: 08/902,776

[22] Filed: Jul. 30, 1997

[51] Int. Cl.$^6$ ................................................. G11C 16/04
[52] U.S. Cl. .............................. 365/185.03; 365/185.24; 365/185.33
[58] Field of Search ......................... 365/185.03, 185.24, 365/185.33

[56] References Cited

U.S. PATENT DOCUMENTS

| | | | |
|---|---|---|---|
| 5,043,940 | 8/1991 | Harari | 365/185.03 |
| 5,172,338 | 12/1992 | Mehrotra et al. | 365/185.03 |
| 5,287,478 | 2/1994 | Johnston et al. | 711/111 |
| 5,297,148 | 3/1994 | Harari et al. | 365/185.33 |
| 5,313,585 | 5/1994 | Jeffries et al. | 711/201 |
| 5,359,569 | 10/1994 | Fujita et al. | 365/185.09 |
| 5,369,757 | 11/1994 | Spiro et al. | 371/12 |
| 5,430,859 | 7/1995 | Norman et al. | 365/185.33 |
| 5,450,341 | 9/1995 | Sawada et al. | 365/185.24 |
| 5,475,693 | 12/1995 | Christopherson et al. | 371/10.2 |
| 5,479,633 | 12/1995 | Wells et al. | 711/103 |
| 5,485,422 | 1/1996 | Bauer et al. | 365/185.21 |
| 5,488,711 | 1/1996 | Hewitt et al. | 365/238.5 |
| 5,515,317 | 5/1996 | Wells etal. | 365/185.21 |
| 5,539,690 | 7/1996 | Talreja et al. | 365/185.03 |
| 5,546,351 | 8/1996 | Tanaka et al. | 365/230.06 |
| 5,574,879 | 11/1996 | Wells et al. | 365/185.33 |
| 5,606,532 | 2/1997 | Lambrache et al. | 365/238.5 |
| 5,644,539 | 7/1997 | Yamagami et al. | 365/185.33 |
| 5,663,901 | 9/1997 | Wallace et al. | 365/185.33 |
| 5,671,388 | 9/1997 | Hasbun | 711/103 |
| 5,717,886 | 2/1998 | Miyauchi | 395/430 |
| 5,732,408 | 3/1998 | Takahashi | 711/113 |
| B1 5,172,338 | 7/1997 | Mehrotra et al. | 365/185.03 |

FOREIGN PATENT DOCUMENTS

| | | |
|---|---|---|
| 8171515 | 7/1996 | Japan. |
| WO9518407 | 7/1995 | WIPO. |

*Primary Examiner*—Trong Phan
*Attorney, Agent, or Firm*—Majestic, Parsons, Siebert & Hsue

[57] ABSTRACT

A memory system including an array of flash EEPROM cells arranged in blocks of cells that are erasable together, with individual cells storing more than one bit of data as a result of operating the individual cells with more than two detectable threshold ranges or states. Any portion of the array in which data is not stored can be used as a write cache, where individual ones of the cells store a single bit of data by operating with only two detectable threshold ranges. Data coming into the memory is initially written in available blocks in two states since writing in more than two states takes significantly more time. At a later time, in the background, the cached data is read, compressed and written back into fewer blocks of the memory in multi-state for longer term storage at a reduced cost.

21 Claims, 5 Drawing Sheets

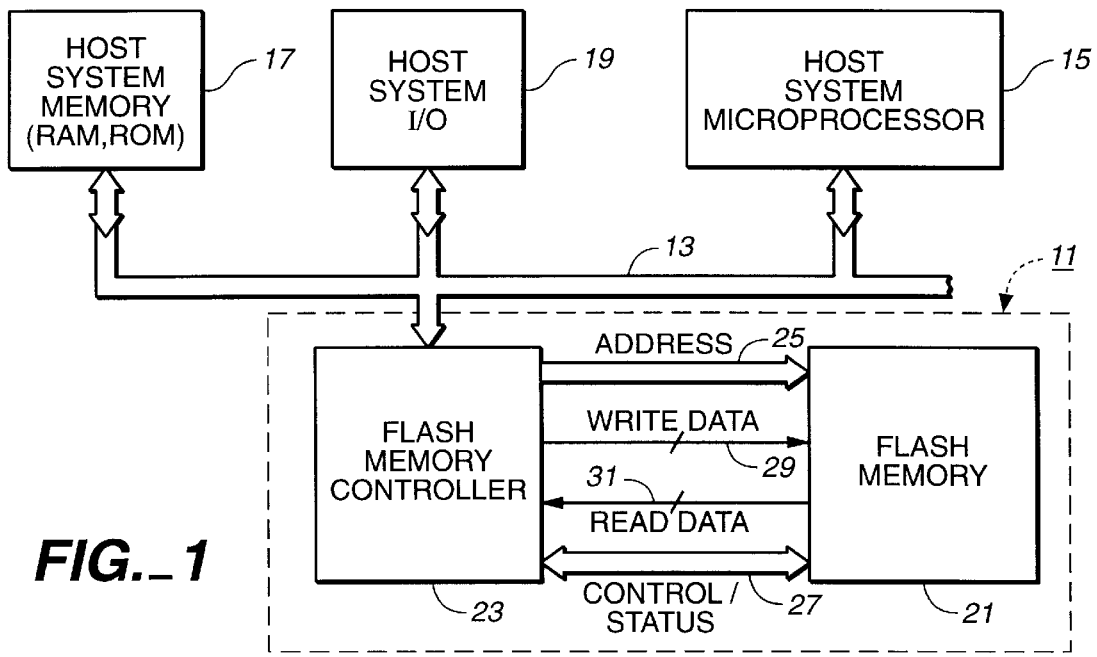
FIG._1
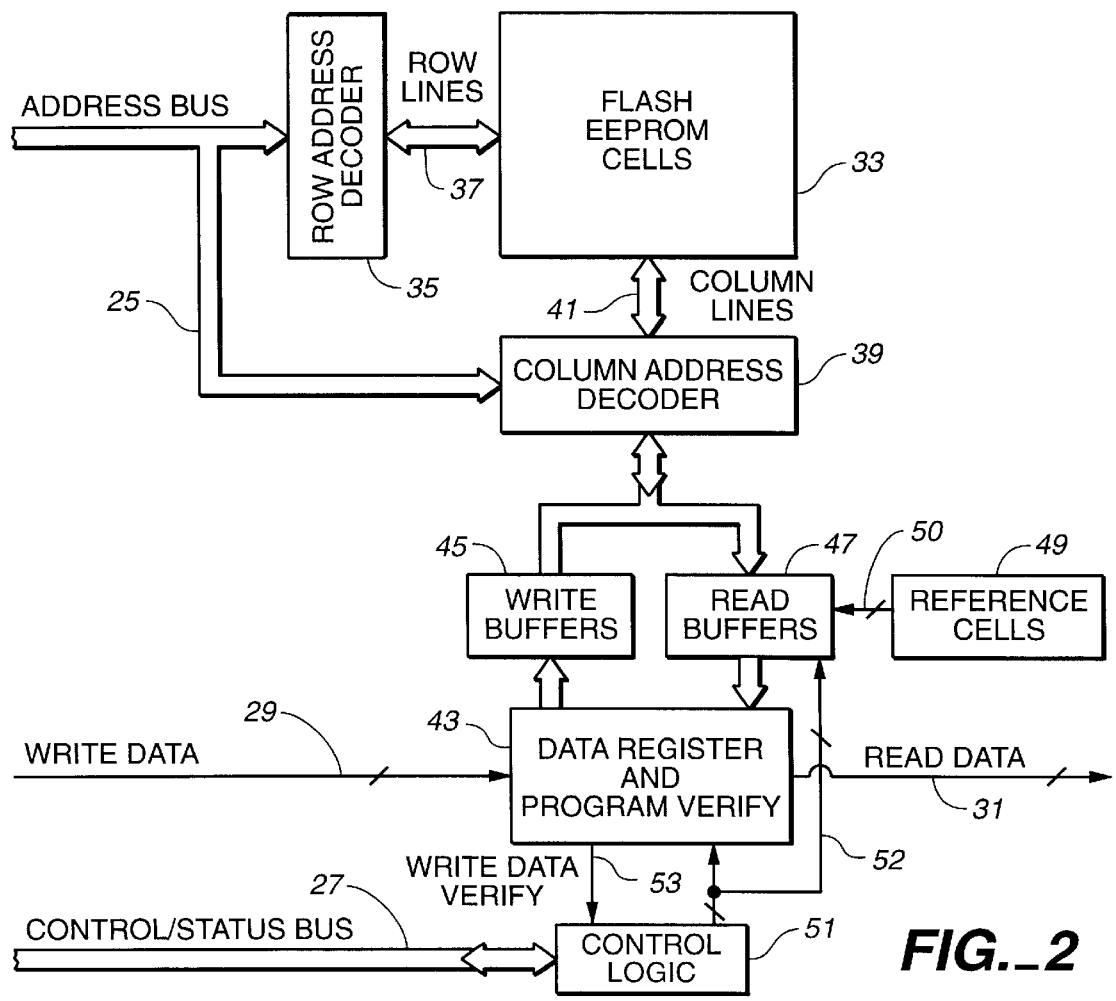
FIG._2

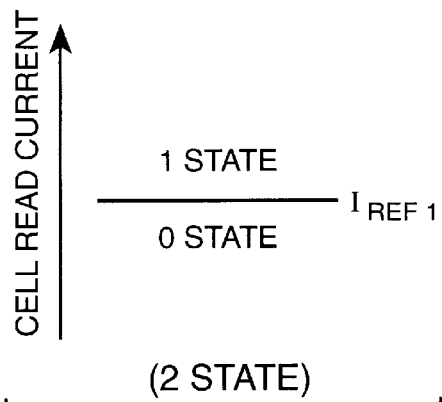
FIG._3A
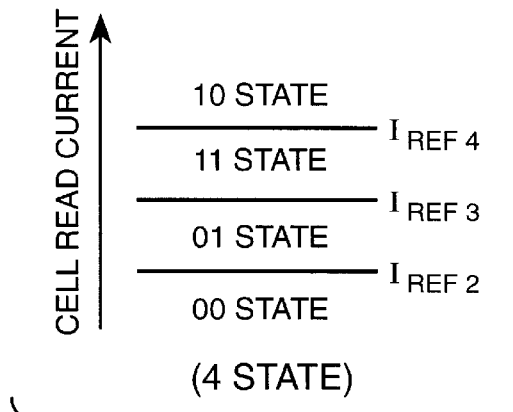
FIG._3B
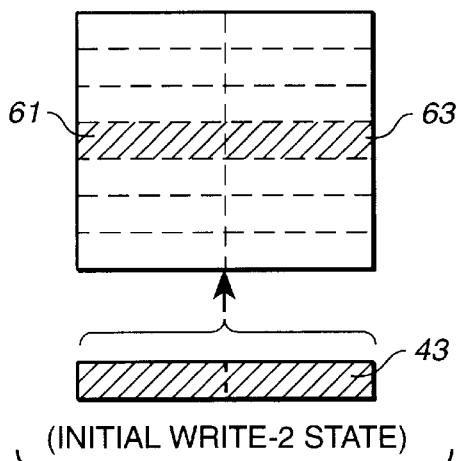
FIG._4A
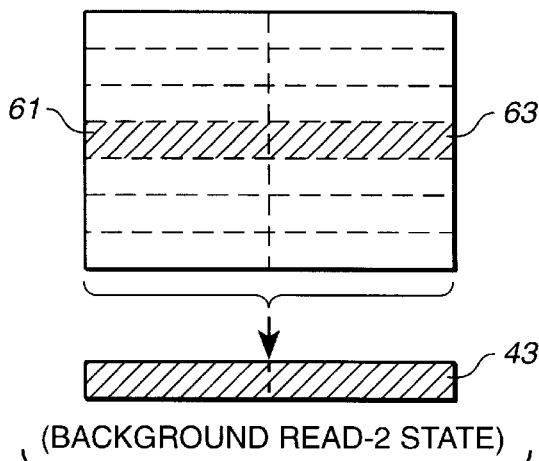
FIG._4B
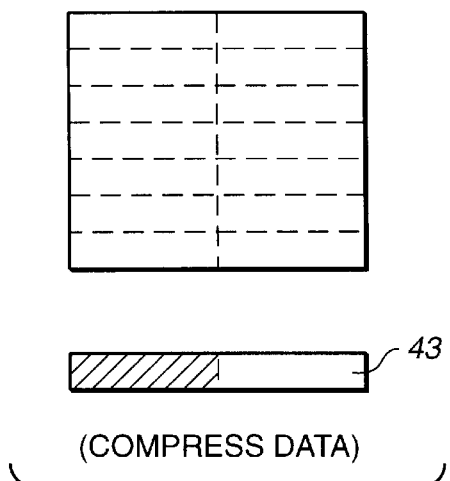
FIG._4C
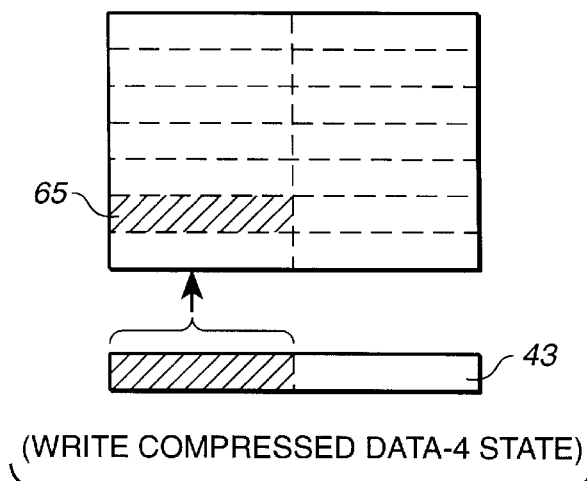
FIG._4D

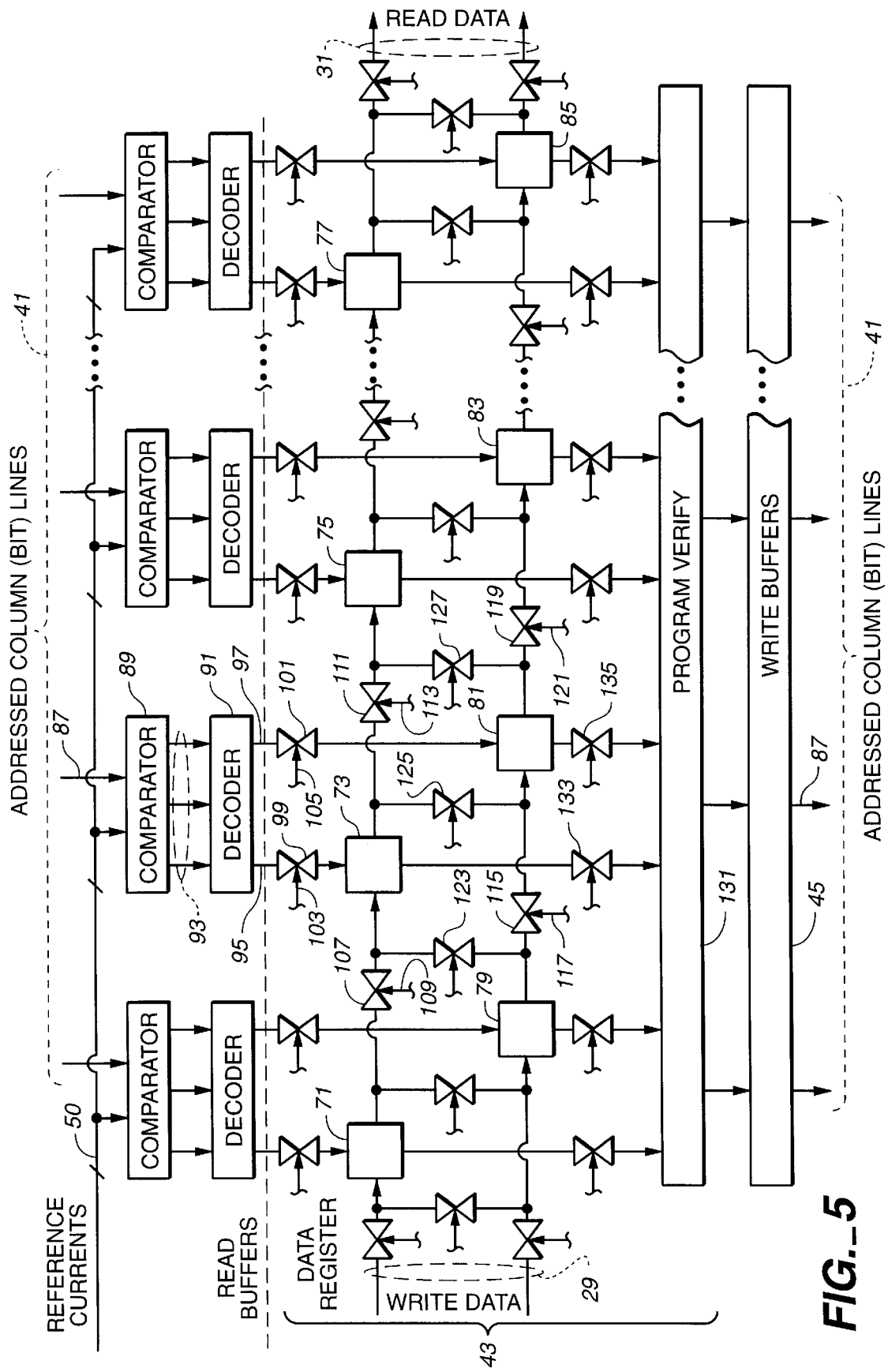
FIG._5

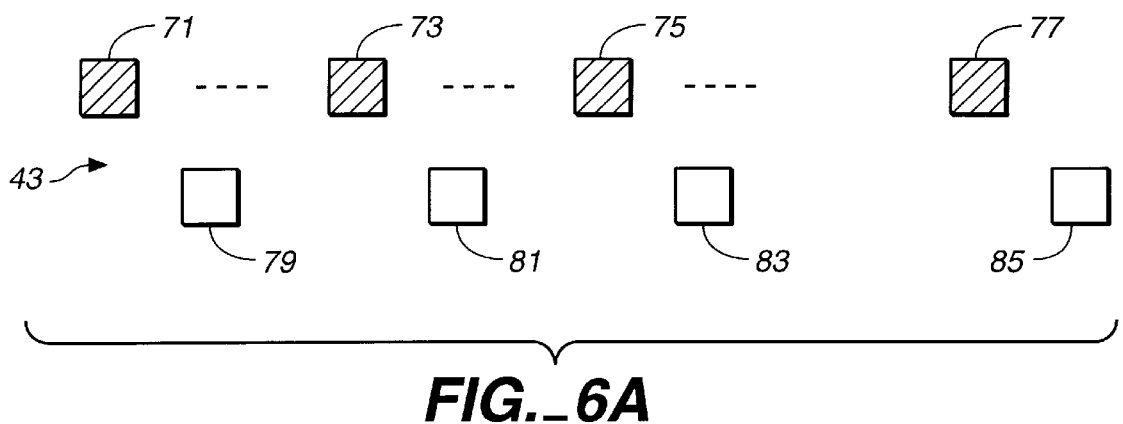
FIG._6A
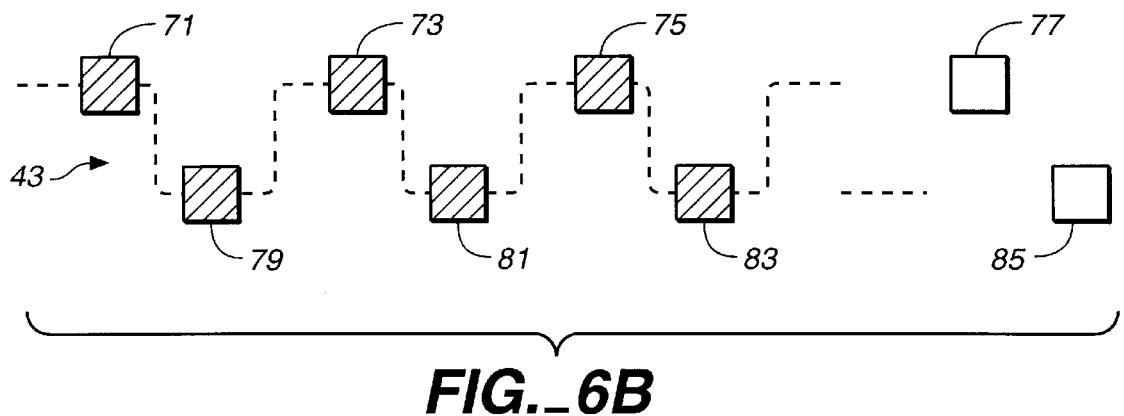
FIG._6B

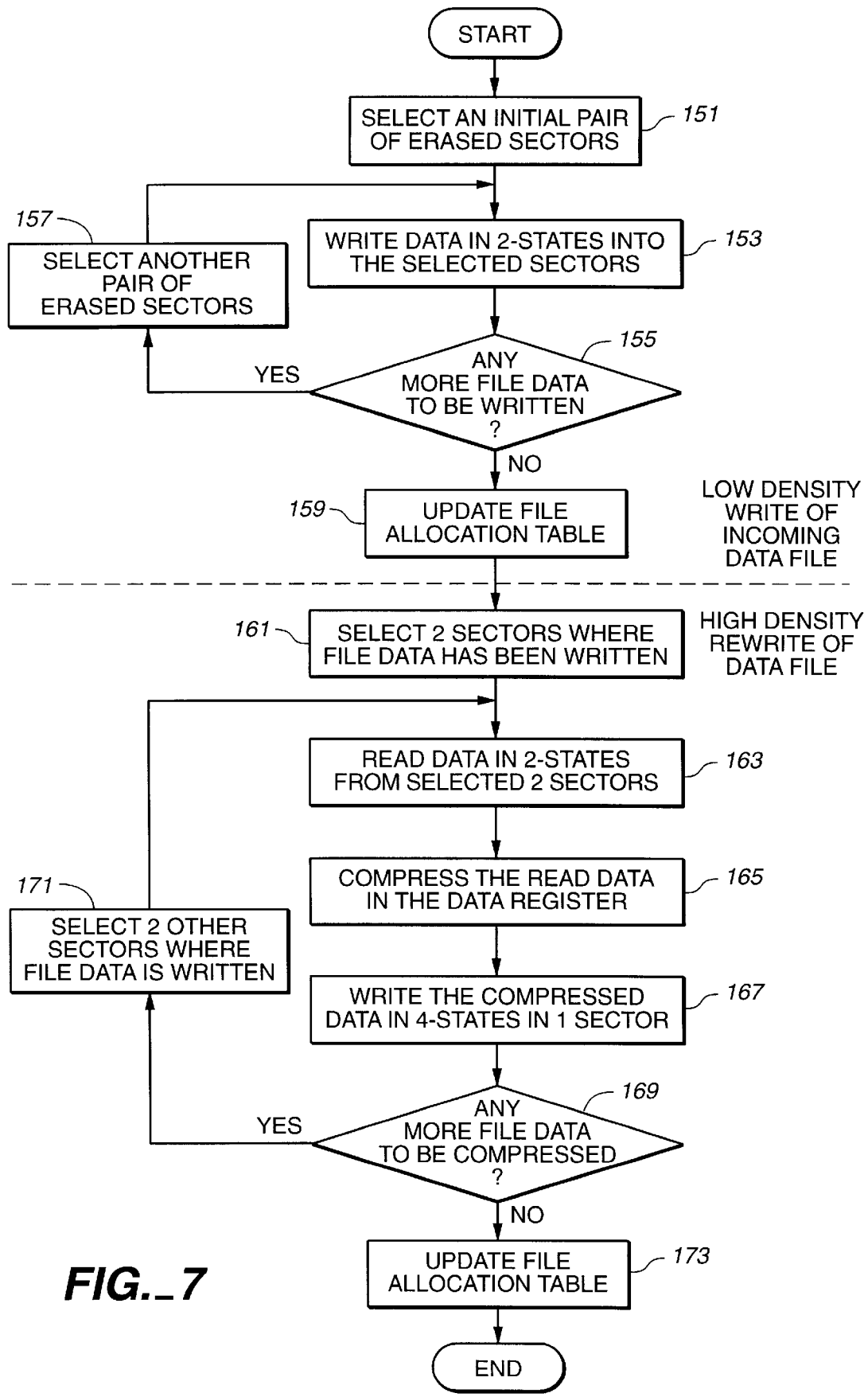
FIG._7

MULTI-STATE NON-VOLATILE FLASH MEMORY CAPABLE OF BEING ITS OWN TWO STATE WRITE CACHE

BACKGROUND OF THE INVENTION

This invention relates generally to flash electrically erasable and programmable read only memories (EEPROMs), and, more particularly, to an improvement in the speed of programming this type of memory when its memory cells are individually operated with more than two threshold states (termed "multi-state" or "multi-level" operation) to store more than one bit of data.

Existing commercial flash EEPROM products operate each memory cell with two ranges of threshold voltages, one above and the other below a breakpoint level, thereby defining two programmed states. One bit of data is thus stored in each cell, a 0 when programmed into one state and a 1 when programmed into its other state. A chunk of a given number of bits of data is programmed at one time into an equal number of cells. The state of each cell is monitored during programming so that application of programming voltages stops when the threshold level an individual cell is verified to have moved within the range that represents the value of the bit of data being stored in the cell.

In order to increase the amount of data stored in a flash EEPROM system having a certain number of storage cells, the individual cells are operated with more than two threshold level states. Preferably, two or more bits of data are stored in each cell by operating the individual cells with four or more programmable states. Three threshold breakpoint levels are necessary to define four different threshold states. Such a system is described in U.S. Pat. Nos. 5,043,940 and 5,172,338, which are being incorporated herein by this reference. Since an available operating range of the individual cells is divided into an increased number of states, the range of each state is smaller. This requires more time to program since a rate of programming is reduced in order to avoid overshooting a desired small threshold range. If more than four programmable states are provided in each cell, the individual ranges become even smaller, and programming requires even more time.

In order to assure that the state of a cell programmed into a particular threshold range is accurately read after a period of time, whether being operated in two states or multi-states, such programming is usually performed with an added margin. That is, rather than programming a cell into a desired threshold range barely past its threshold breakpoint level, the cell is programmed an amount beyond the breakpoint level by some margin. Use of this margining technique can also increase the amount of programming time since the sizes of the individual threshold ranges are effectively reduced.

Therefore, it is a primary object of the present invention to provide a technique for rapidly programming flash EEPROM systems without having to sacrifice the density or accuracy of the data stored therein.

SUMMARY OF THE INVENTION

This and additional objects are accomplished by the present invention, wherein, briefly and generally, incoming new data is written into a flash EEPROM system in one manner with a first set of constraints, and then that stored data is subsequently read from and rewritten into the system in another manner with a second set of constraints. In the examples considered herein, the first set of constraints emphasizes the speed of initially programming incoming data and the second set of constraints includes either increasing the density of data storage or the accuracy of long term storage, or both, but the present invention is not limited to these examples. By so programming new data in two steps, certain tradeoffs that exist in a single programming step are uncoupled from one another, thus improving overall performance. The second step of rewriting the data may be performed in the background while other data is initially programmed into or read from the memory system without slowing down either of those other operations. In the second step, the data may be rewritten into the same or different memory space than where the data is initially written in the first step. The first and second steps may either be performed in a single memory integrated circuit (I.C.) chip or, if the flash EEPROM system includes more than one I.C. chip, in different chips.

According to a first specific aspect of the present invention, incoming new data is stored with a low density in a high density memory because it can be done in less time, followed by later causing that data to be read out of the memory, compressed and then written back into the memory with the higher density of which the memory is capable. An appropriate commercially available data compression algorithm may be employed for this purpose but this is not the preferred implementation of the invention. Rather, it is preferred that the cells of a flash EEPROM system be programmable into either a low or a high number of states. When new data is being received for storage by the system, it is temporarily stored in available memory space at a low number of states per cell. Later, preferably in the background, this data is read out and reprogrammed into the memory with the high number of states. In a specific example, data is first written in two states (1 bit per cell) and then later compressed and rewritten in more than two states per cell. The rewriting can be at four states (2 bits per cell) or higher, sixteen states (4 bits per cell) being a currently useful example. Use of this multi-state compression does not preclude also applying a commercially available compression algorithm to the same data in the usual manner either prior to its initial storage at a low number of states per cell or upon rewriting the data in the high number of states per cell.

This technique has the advantage of initially writing data with the higher speed of low data density storage while enjoying the benefits of high density long term storage of the data. Data are initially stored with a low density for only a short time in any unused part of the flash EEPROM memory. No separate write cache memory, such as those implemented with a volatile memory, need be employed. Nor is it necessary to dedicate some portion of the flash EEPROM memory to operate only as a write cache. Use of a dedicated portion of the memory as a write buffer would cause the cells within that portion to be used much more than other portions of the memory, contrary to the usual desire to evenly wear the memory. Therefore, portions of the flash EEPROM memory of the present invention that store data with the high density can also be operated as a write cache in order to spread this heavy use function across the memory. The identity of the memory sectors being used for long term, high density storage are maintained, such as by a file allocation table, in order to be able to direct low density incoming data to sectors that are unused.

In the course of implementing this first aspect of the present invention, separate counts may be maintained of the number of times that each sector has been erased and programmed with a low number of states and a high number of states. This allows control of the sector assignments of the initial data and the compressed data in order to even the wear among the sectors. The separate counts are maintained because instances of low density programming can cause more wear than instances of high density programming. The two cycle counts are then used to separately even out the number of times that the various sectors are programmed with high and low density.

According to another specific aspect of the present invention, incoming new data is initially stored without margining, or with a small margin, in order to maintain a fast programming speed. Later, preferably in the background, this data is read out of the memory and written back into the memory with a higher margin. The higher margin reduces the probability of erroneous data reads that can result from the charge of individual cells shifting small amounts over time as the result of disturbs from reading the cells and the reading and writing of adjacent cells on the same I.C. chip.

It will be recognized that the use of two programming operations for data coming into the memory system takes more power than a single programming operation. Therefore, since this can be a disadvantage in certain portable applications where the power source is a battery, the present invention also contemplates providing the option of initially programming the memory system in a single operation. This single operation would, in the examples being described herein, directly program incoming data in multistates and/or with a desired long term margin. This power saving programming mode may be manually selected by the user, or automatically by the memory system controller, in cases where the initial programming speed is not so important. Alternatively, the two programming step technique can be implemented, when the initial writing step is performed during battery operation, by postponing the data rewrite step until the memory system is connected to a power line source.

Additional objects, advantages and features of the various aspects of the present invention will become apparent from the following description of its preferred embodiments, which description should be taken in conjunction with the accompanying drawings.

BRIEF DESCRIPTION OF THE DRAWINGS

FIG. 1 illustrates a flash EEPROM mass storage memory of a type in which the present invention may be utilized, as connected with a host computer system;

FIG. 2 is a block schematic diagram of the flash memory block of FIG. 1 that implements the present invention;

FIGS. 3A and 3B illustrate low and high density memory cell operating windows, respectively, that are utilized in the flash memory of FIG. 2;

FIGS. 4A–4D are conceptual diagrams of the flash memory of FIG. 2 that illustrate its steps of operation according to one aspect of the present invention;

FIG. 5 shows an example circuit for the data register and program verify block of FIG. 2;

FIGS. 6A and 6B illustrate the use of the data register and program verify block of FIG. 2 for two and four state operation, respectively; and FIG. 7 is a flow chart that illustrates operation of the flash memory of FIGS. 1 and 2 according to the one aspect of the present invention.

DESCRIPTION OF THE PREFERRED EMBODIMENTS

A mass storage memory system 11 in which the various aspects of the present invention are implemented is shown in FIG. 1 to be connected to a system bus 13 of a host computer. The host computer is shown to include, connected with its bus 13, a central processor 15, some volatile memory 17 and a circuit 19 providing connection with input/output devices or circuits. Such a host system can be a personal computer, a camera, or any other system that requires a mass storage memory system. That memory system 11 functionally includes a block 21 of an array of flash EEPROM cells and associated decoder and control circuits, and a controller 23 connected with the block 21 by means of an address bus 25, a control status bus 27, two-bit (for example) serial write data lines 29 and two-bit (for example) serial read data lines 31. Both the memory array 21 and controller 23, all of the memory system 11, can be implemented on a single I.C. chip. Alternatively, two or more I.C. chips can be used to form the flash memory 21 with the controller 23 for all the memory chips being included on its own dedicated chip or on one of the multiple memory chips.

The memory system 11 can either be permanently built into the computer of its host equipment or can be packaged into a small card that is removably connected to the host. Prior U.S. Pat. Nos. 5,297,148 and 5,430,859, and pending applications Ser. Nos. 08/527,254, now U.S. Pat. No. 5,663,901, and 08/781,539, provide background and implementation details of such a memory system in which the various aspects of the present invention may be included. These patents and applications are hereby incorporated herein by this reference.

The block 21 of the memory system 11 is shown in FIG. 2. An array 33 of EEPROM cells is organized into rows and columns. A decoder 35 selects one or more of row (word) lines 37 designated by a portion of an address on the memory system address bus 25. Similarly, a decoder 39 selects one or more of column lines 41 in response to another portion of an address on the address bus 25. The selected row and column lines are energized to specific voltages for reading, programming or erasing the memory cells that are so addressed. An example of the memory cell array is described in the patents identified above as Background, wherein the row lines are connected to the control gates of a row of memory cells and the column lines are source/drain diffusions. For programming and reading, a single row line and a number of column lines are simultaneously selected by the decoders 35 and 39 for programming or reading a number of cells in parallel.

During programming, the voltages of the selected column lines are set by a chunk of incoming data that is received by data register 43 and temporarily stored in write buffers 45. During reading, currents passing through addressed cells and their column lines are compared in a read buffer circuit 47 with currents in lines 50 that are passed through programmed reference cells 49, the results of that comparison providing the states of the addressed cells that are applied to the data register 43 in a manner to output the read data in lines 31. The program, read and erase operations are controlled by control logic 51 in response to signals on the control/status bus 27. The control logic 51 also receives a signal in a line 53 from the data register 43 that indicates when it has been verified that all bits of a chunk of data have been successfully programmed.

The cell array 33 is typically divided into blocks or sectors of cells that are addressable together for simultaneous erasure. According to one implementation, each block also typically includes enough cells to store the same number of bytes of user data as a standard disk drive sector, namely 512 bytes, but may be some other size. Each block also includes an additional number of cells to store overhead information related to the block or the user data stored in it, and optionally spare cells, a total of 32 bytes in one implementation. The overhead information is similar to a header to a disk drive data sector.

FIG. 3A indicates two state operation of an EEPROM cell, the current read being detected to be either on one side or the other of an $I_{REF1}$ breakpoint current level. In the example of FIG. 3A, the cell is in a 0 state when the read current is less than $I_{REF1}$ and in a 1 state when higher than $I_{REF1}$. This operation causes each cell to store one bit of data. The amount of current read from a cell is a result of the threshold voltage level of the cell that was set during programming by adjusting the amount of charge on its floating gate.

FIG. 3B indicates a four state operation, where each cell stores two bits of information, as an example of multi-state operation. Three breakpoint current levels $I_{REF2}$, $I_{REF3}$ and $I_{REF4}$ divide an operating current window of the memory cell into four states, one indicating the two bits of stored data to be 00, and the others 01, 11 and 10, respectively. Alternatively, the memory cells may be operated with three states or more than four states. Operation with sixteen states, for example, is quite useful since four bits of data are then stored by each cell. The multi-state examples described herein are four states, for simplicity but the present invention is certainly not limited to four state operation.

The memory system being described is capable of selecting the operation of each block, or a group of blocks together, in one of two modes. One is to operate each cell with two states since this is the fastest way to program incoming data. The other mode is a multi-state operation, wherein each cell is operated with three or more states. Multi-state operation has an advantage of increasing the amount of data that is stored in each block of cells, thereby reducing the cost of the end product for a given data storage capacity. For example, if a sector stores 512 bytes in two state operation, that same sector will store 1024 bytes of data in four state operation, 2048 bytes of data with sixteen state operation, and so forth. A drawback of multi-state operation, however, is an increased amount of time necessary to program data. This is because, as illustrated in FIGS. 3A and 3B, the current range (and thus also the threshold voltage range) of each state is reduced with multi-state operation. The more operating states, the smaller each range. A typical programming technique alternately applies programming voltage pulses to the addressed cells and verifies their states by reading the cell current levels. The added time is required as the ranges are reduced because care must be taken to avoid overshooting the desired range by excessive programming pulse voltages or durations. Therefore, each increment of programming charge applied to addressed cells is reduced between verification steps as compared to two state writing. This necessarily increases the number of programming and verification cycles, and thus the time necessary to complete a full data programming operation.

Therefore, when the speed of programming an incoming data file is important, it is first stored in blocks of cells that are operated in two states and then later compressed in the background into a fewer number of blocks. FIGS. 4A–4D illustrate this process for an example of a data file that occupies two blocks of cells operated in two-states. In FIG. 4A, the data are transferred from the data register 43 into blocks 61 and 63 of the memory array 33, as part of the initial fast programming of the file. Later, this data is read back out of blocks 61 and 63 and into the data register 43 in, of course, two states, as illustrated by FIG. 4B. This read data is then compressed within the data register 43 to be written into a single block that is operated in four states, as shown in FIG. 4C. FIG. 4D shows the compressed data being written into another block 65 that has been previously erased. Alternatively, the compressed data can be rewritten into one of the initial sectors 61 or 63 after it is erased. An advantage of writing to different sectors, however, is that in case of a failing condition such as a loss of power during rewriting, a trail of the original data is maintained. Furthermore, the original two-state copy is preferably erased only after the rewriting step is completed and verified.

The rewriting steps of FIGS. 4B–D are accomplished either when the memory system is otherwise idle or in the background while other memory operations are occurring, such as during the initial writing of other data in two states to other memory sectors, during the reading of other data from multi-state sectors, or during the erasing of the cells of other sectors. This background rewrite can be accomplished without slowing down any of these other memory operations.

As can be seen from FIGS. 4A–4D, the data file, temporarily stored in two blocks with a density of one data bit per cell, is later stored in one block with a density of two bits per cell. This is a 2:1 data compression, resulting from a 1:2 increase in the number of bits stored in each memory cell. As another example, if the data is compressed for long term storage in cells operating with sixteen states, a 4:1 data compression results from a 1:4 increase in the number of bits each cell stores.

Referring to FIG. 5, an example of the data register and program verify block 43 (FIG. 2) is given. The circuit of FIG. 5 is operated to perform the steps described with respect to FIGS. 4A–4D. The data register 43 include two rows of individual latches, one row including latches 71, 73, 75 and 77, and the other row including latches 79, 81, 83 and 85. Each row contains a number of latches equal to a number of bits in a chunk of data that is programmed and/or read in parallel in two states. A pair consisting of one latch from each of the rows is operably connected with each of the addressed column lines 41. For example, latches 73 and 81 are connected with an addressed column line 87 through a current comparator 89 and decoder 91 of the read buffer circuit 47. The comparator 89 compares the current of an addressed cell passing through the column line 87 with the reference currents in circuits 50. A comparator output in lines 93 are decoded into two bits in the lines 95 and 97, which lines are connected respectively through switching transistor circuits 99 and 101 to the single bit latches 73 and 81. The switching transistors 99 and 101 are controlled between conductive and non-conductive states by clock signals in respective lines 103 and 105 from the control logic 51 (FIG. 2). These two switching transistors are rendered conductive at the appropriate instances in order to transfer data bits to their respective latches 73 and 81.

The latches of the data register 43 may be connected together in various ways through additional switching transistor circuits. The latch 73, for example, has switching transistors 107 and 111 connected on either side of it to allow series connection with the adjacent latches 71 and 75, in response to control signals in lines 109 and 113 from the control logic 51 that render the switching transistors conductive. A similar pair of switching transistors 115 and 119 are controlled by signals in lines 117 and 121. When the switching transistors 107, 111, 115 and 119 are rendered non-conductive by their respective control signals, the latches 73 and 81 may be connected in series as part of a single register by rendering conductive switching transistors 123, 125 and 127 that are connected between the two rows of latches.

A single row of latches is used for two state programming and reading. In this case, one of the latches 73 or 81, depending upon whether the top or bottom row of latches is utilized, is loaded with the one bit stored in the memory cell connected to the addressed column line 87. For example, when the top row of latches is used, its series connected switching transistors 107 and 111 are turned on, while the switching transistors 123, 125 and 127 connected between rows and the switches 115 and 119 of the unused bottom row are all turned off. Such a use of the top row of latches for a chunk of data is illustrated in FIG. 6A, wherein the shaded blocks represent latches being used and the unshaded blocks those latches not being used. This is the configuration of the data registers 43 during the operations illustrated in FIGS. 4A and 4B.

For four state programming and reading, a combination of both rows of latches are connected into a single register. Here, the series connected switching transistors 107, 111, 115 and 119 are turned off, while the switching transistors 123, 125 and 127 are turned on. The same sized chunk of data is loaded into less than all of the latches of each row, as illustrated in FIG. 6B. In this example, the chunk of data is loaded into the latches of each row for four state encoding, as compared to using all of the latches of one row for two state encoding. FIG. 6B also represents the configuration of the data registers 43 during the compressed data write operation illustrated in FIG. 4D.

Thus, the memory array 33 can be operated in either of its two or four state modes in response to an appropriate set of switching transistor control signals from the control logic 51. In either case, a chunk of data to be programmed is shifted into the data register 43 from the lines 29, and a chunk of data that has been read is shifted out of the data register 43 through lines 31.

The individual latches are also connected to their respective addressed column lines through a program verify circuit 131 and write buffers 45. For example, the latches 73 and 81 are connected through switching transistor circuits 133 and 135 to the program verify block 131. During programming, a chunk of data to be written into the memory cell array 33 is loaded into the block 131 until a periodic read/verify operation reveals that one or more cells has been programmed to the desired level, at which point further programming of those cells ceases while continuing to program those which have not yet been programmed to the desired level. Programming of the chunk of data is terminated when all the cells being programmed in parallel have all been programmed into their desired states.

As indicated in FIG. 4C, data is compressed within the data register itself, either in response to detailed control signals from the controller 23 through the control logic 51, or from the control logic 51 itself by including within the logic a state machine or the like. This compression occurs by reading a chunk of data in two states from the memory cell array 33 into one of the rows of latches of the data register 43, as indicated in FIGS. 4B and 6A. Next, this data is shifted within the data register by moving the bit in the latch 73 to the latch 79, the bit from the latch 75 to the latch 73, the bit from the latch 83 to the latch 81, and so on, until two bits are stored for each of the memory array cells to be programmed, as indicated by FIGS. 4C and 6B. The cells are then programmed, as indicated by FIG. 4D.

Although the example being described initially programs incoming data in two states and later compresses it by a four state programming step, programming and reading in other states is also possible. It will generally be desired, however, to initially store incoming data in two states, since this gives the fastest write operation possible. The subsequent multistate storage will improve the storage density when anything more than two storage states per cell is utilized. If sixteen state storage is employed, for example, four bits of data are stored in each memory cell. To so operate, the data register 43 includes four rows of latches, instead of the two rows shown in FIG. 5, so that there are four latches provided for each of the memory cells that is being programmed.

An example of operation of the memory system described above to store a data file in two and four state modes is given in the flowchart of FIG. 7. In a step 151, a pair of memory blocks or sectors is chosen to be used as a temporary buffer. Alternatively, if the permanent programming is in more than four states, such as sixteen states, the number of sectors initially selected would be more, in that case four. This is the amount of data that will later be compressed into a single sector. In a next step 153, an amount of data that fills two sectors is programmed into the selected two sectors.

In the usual case where the data file contains more data than can be stored in two sectors, as indicated by a step 155, a next step 157 selects another pair of sectors to receive up to a further two blocks worth of data. Data is than written by a repeat of the step 153. Once the entire file has been programmed into the memory, a table of sector locations of file data is updated with the locations of the file just recorded, in a step 159. At this point, the incoming data file has been recorded in the fastest way but with use of the most memory space.

As soon as other demands on the memory system allow, this file is compressed into fewer sectors of memory space, in this example one-half the space. In a step 161, the file allocation table is read to determine a first pair of sectors where the file data was stored in two states. The data is then read from those two sectors, in a step 163. In a next step 165, data is compressed in the data register 43 in the manner discussed above with respect to FIGS. 4, 5 and 6. The compressed data is then written into a single sector, as indicated by a step 167. In a step 169, it is determined whether the data file being compressed has been stored in more than two sectors. If so, a step 171 includes selecting from the file allocation table another pair of sectors containing data of the file and then repeating steps 163–169 with respect for that next pair of sectors. Once data from all sectors containing data of the subject file has been compressed and rewritten, the file allocation table is updated with the new sector locations of the compressed file data, as indicated by a step 173.

Whenever a data file is initially written, or is subsequently rewritten in compressed form, the number of states (such as the two and four states of the present example) in which each sector containing the data is written is also preferably stored for reference when the data file is later read out of the memory. This read number is then used to set the current threshold levels of the sense amplifiers before beginning to read the data file. This number of states can be written, for example, as part of steps 159 and 173 when the sector locations of the written data file are stored, by including the number of states as part of the file allocation table. Alternatively, the number of states in which data is written into individual sectors may be stored as part of the header or other overhead data maintained for each sector. Upon a sector being later designated for a data read, its header or other overhead information is arbitrarily read in one of the two known states and, if that is determined not to provide valid data, it is read again in the other number of states.

In the examples being described, the compressed data are written to sectors different from those initially used to temporarily store the data. Since the erasing process takes some time, this allows selection of sectors for storing the data in multi-state that have already been erased in the background and thus avoids having to perform erasing as part of the overall compression process. This also maintains a trail of the data during the writing of the compressed data in order to enable recovery from a potential power or other failure during such writing.

Because floating gate memory cells change some characteristics with an increasing number of cycles of erasing and programming, and have a maximum number of such cycles that can be endured, it is usually desired to maintain a count of the number of cycles experienced by each sector or group of sectors of the array. This count can be used for various purposes, one being to even out the wear of the individual sectors. Several specific wear leveling algorithms are described in U.S. patent application Ser. No. 07/759,212, filed Sep. 13, 1991, which application is hereby incorporated herein by this reference. For embodiments implementing such wear leveling, it is incorporated within the steps 151 and 157, where sectors are selected to receive the incoming data file, combined with the step 167, which includes the selection of a sector or sectors in which the compressed data are to be written.

A primary cause of the change in performance from usage is wear out associated with electrons that are trapped in an erase electrode dielectric of a memory cell each time that cell is erased. There is also degradation arising from programming an EEPROM cell, and that amount of degradation may be different for multi-state programming than for two state programming. Therefore, a separate count is preferably maintained of the number of times each sector or group of sectors has been programmed into two and into four (or more) states. Since each instance of programming a sector is preceded by erasing the sector, the counts that are maintained are of the number of cycles of erasing and programming in the two different modes. This then allows the memory system to maintain even wear of both types of cycles, if that is desired. These counts are usually maintained as part of the header or other overhead data that is stored along with user data in each sector, but alternatively can be stored outside of the sector(s) to which they pertain.

Alternatively, in applications where the use of the memory system is not expected to be large enough to require such wear leveling, certain blocks or sectors may be dedicated for the initial two-state data writes. In cases were the flash memory is implemented by multiple chips, the memory cells of one of the chips may be dedicated to the two state cache function and the remaining chip(s) to multi-state operation. However, it is usually preferred to operate all or significantly all of the memory in both modes of operation.

In the embodiment described above, the data rewrite function will normally be performed as soon after the initial two state write as possible in order to maximize the available memory and avoid an unmanageable accumulation of rewrites that need to be performed. Alternatively, however, the memory system can be operated in two states without rewriting the data in multi-states until some threshold proportion of the memory system sectors have been filled with data stored in two states. At that point, the controller can proceed to cause the data stored in two states to be rewritten in multi-states in order to free up more memory space for additional data.

Further, the embodiment described above includes only one rewrite. A system can be implemented, however, to include two or more data rewrite operations, each rewrite further compressing the data. For example, if an incoming data file initially stored in two states is automatically rewritten in four states to reduce the number of sectors required to store the data, the controller can be programmed to again rewrite the data file in sixteen states in even fewer sectors when the number of free memory sectors falls below some set threshold number.

Although the various aspects of the present invention have been described with respect to their preferred embodiments, it will be understood that the invention is entitled to full protection within the scope of the appended claims.

It is claimed:

1. A non-volatile data memory, comprising:
   an array of flash EEPROM cells organized into blocks of cells that are individually erasable as a unit,
   a decoder responsive to address signals to address specific cells within a block for a data transfer operation, and
   a data register circuit operably connectable through the decoder to transfer data between the register and the addressed cells, said data register circuit being operable to perform said data transfer with a density of either a first or a second number of data bits per individual addressed cell in response to a control signal, said data register circuit additionally being capable of reading data from the array at the first data bit density and writing the read data back into the array at the second data bit density.

2. The memory of claim 1, wherein the data register circuit further includes a number of register stages per addressed cell equal to a higher of the first and second numbers of data bits per addressed cell, and wherein the data register circuit operates to store the data read from the array at the first data bit density in fewer than said number of register stages and then shift at least some of the read data bits into said number of register stages per addressed cell for writing the read data back into the array at the second data bit density.

3. The memory of either one of claims 1 or 2, wherein said first data bit density is one bit per cell and said second data bit density is more than one bit per cell.

4. A method of operating a memory system of flash EEPROM cells, comprising:
   writing a file of incoming data into the system with a first set of memory cell threshold voltage levels,
   thereafter, reading said data file from the system, and
   rewriting the read data file into the system with a second set of memory cell threshold voltage levels different from said first set, wherein the second set of memory cell threshold voltage levels include higher margin voltages within threshold voltage ranges than the first set of memory cell threshold voltage levels.

5. The method according to claim 4, wherein the second set of memory cell threshold voltage levels additionally includes a higher number of threshold voltage ranges than the first set of memory cell threshold voltage levels.

6. The method according to either of claims 4 or 5, including performing the method on flash EEPROM cells formed on a single integrated circuit chip.

7. The method according to either of claims 4 or 5, including performing the method on flash EEPROM cells formed on two or more integrated circuit chips.

8. A method of operating a flash EEPROM cell array, comprising:
   caching a file of incoming data into a given number of cells of the array according to an amount of data within the file, thereafter, reading said data file from the array, compressing the read data file by applying a compression algorithm to the read data file that translates the data file into a compressed file, and writing the compressed data file into a significantly fewer number of cells of the array than said given number.

9. A method of operating a flash EEPROM cell array on one or more integrated circuit chips, comprising:

operating individual cells of at least a portion of the array with either a first number of storage states or a second number of storage states higher than the first number, writing an incoming data file into cells of said at least a portion of the array in the first storage state, thereafter, reading said data file from the array, and rewriting the read data file into said at least a portion of the memory in the second state, thereby to compress storage of the data file into fewer cells of the array, wherein the reading and rewriting of the data file occurs in response to the memory array becoming full with data.

10. The method of claim 9, which additionally includes either writing a second incoming data file into cells of said at least a portion of the array or reading a third data file already stored within the array cells simultaneously with said reading and rewriting of the data file.

11. The method of claim 9, wherein the writing and rewriting operations include both using at least some of the same array cells.

12. The method of claim 9, wherein operating the individual cells includes doing so with a third number of storage states higher than the second number, and additionally comprising, in response to the memory array becoming full with data:

again reading said data file from the array, and rewriting the read data file into said at least a portion of the memory in the third state, thereby to further compress storage of the data file in the array.

13. The method of any one of claims 9–12 wherein the first number is two and the second number is greater than two.

14. The method of claim 13, wherein the second number is four.

15. The method of any one of claims 9–12, wherein the rewriting of the data file includes rewriting said data file into cells of said at least a portion of the array that are different from the cells in which the incoming data file was written in the first storage state.

16. A method of operating a memory system of flash EEPROM cells organized into blocks of cells that are erasable together, wherein the individual cells are operable in any of at least a first data density level of two storage states and a second data density level of more than two storage states, comprising:

initially writing data into blocks of cells at the first density level, determining when a threshold proportion of the memory system blocks are filled with data written into the blocks with the first density level, thereafter compressing data already stored in the memory in the first density level by reading said stored data at the first density level from a first number of blocks of cells and rewriting the read data at the second density level into a second number of blocks of cells less than the first number of blocks of cells, thereby to make a number of blocks of cells equal to a difference between said first and second numbers of blocks available to store additional data, and thereafter storing additional data in at least some of the number of blocks made available by the data compression.

17. The method of claim 16, wherein the additional data is initially stored at the first density level in at least some of the number of blocks made available by the data compression.

18. The method of claim 16, additionally comprising thereafter compressing data already stored in the memory in the second density level by reading said stored data at the second density level from the second number of blocks of cells and rewriting the read data at a third density level into a third number of blocks of cells less than the second number of blocks of cells, thereby to make a number of blocks of cells equal to a difference between said second and third numbers of blocks available to store further additional data.

19. The method of claim 18, wherein the further additional data is initially stored at the first density level in at least some of the number of blocks made available by the data compression.

20. A method of operating a memory system of flash EEPROM cells organized into blocks of cells that are erasable together, wherein the individual cells are operable in any of at least a first data density level of two storage states and a second data density level of more than two storage states, comprising:

writing a file of incoming data into the memory system with a first set of memory cell threshold voltage levels, thereafter, reading said data file from the memory system, rewriting the read data file into the system with a second set of memory cell threshold voltage levels greater than that of said first set, and maintaining separate counts for the blocks individually of the number of times that data has been written into the individual blocks with the first set of threshold voltage levels and the number of times with the second set of threshold voltage levels.

21. A method of operating a memory system of flash EEPROM cells that is alternatively powered from a battery or a power line source, comprising:

writing a file of incoming data into the memory system with a first set of memory cell threshold voltage levels when the memory system is powered from the battery, and thereafter, when the memory system is powered from a power, line source, reading said data file from the memory system, and rewriting the read data file back into the memory system with a second set of memory cell threshold voltage levels that is higher than said first set.

* * * * *